United States Patent [19]

Lietar

[11] Patent Number: 4,970,473
[45] Date of Patent: Nov. 13, 1990

[54] PHASE LOCKED LOOP HAVING PARALLEL COMPARATORS

[75] Inventor: Loic Lietar, Milan, Italy

[73] Assignee: SGS-Thomson Microelectronics S.R.L., Milan, Italy

[21] Appl. No.: 359,353

[22] Filed: May 31, 1989

[30] Foreign Application Priority Data

Jun. 13, 1988 [IT] Italy ............................... 20947 A/88

[51] Int. Cl.$^5$ .............................................. H03L 7/87
[52] U.S. Cl. ..................... 331/1 A; 331/11; 331/27; 307/528; 328/134
[58] Field of Search ...................... 331/1 A, 10, 11, 12, 331/25, 27; 328/133, 134; 307/516, 526, 528

[56] References Cited

U.S. PATENT DOCUMENTS

| | | | |
|---|---|---|---|
| 3,375,448 | 3/1968 | Newman et al. .............. | 331/25 X |
| 3,703,686 | 11/1972 | Hekimian ................... | 331/11 |
| 4,069,462 | 1/1978 | Dunn ........................ | 331/11 |

Primary Examiner—Siegfried H. Grimm
Attorney, Agent, or Firm—Rosen, Dainow & Jacobs

[57] ABSTRACT

A circuit for high-efficiency tuning of video frequencies comprises a closed control loop including a voltage controlled oscillator, a frequeny divider, a phase comparator, and a low-pass filter cascade interconnected via respective inputs and outputs, with the filter output connected to the oscillator input to form the loop. The circuit further comprises a second comparator connected in parallel to the phase comparator between the frequency divider output and the low-pass filter input to compare a reference frequency to a frequency from the divider when the values of each frequencies lie far apart.

4 Claims, 3 Drawing Sheets

PHASE LOCKED LOOP HAVING PARALLEL COMPARATORS

This invention relates to a circuit for high-efficiency tuning of video frequencies, being of a type which comprises a closed control loop including a voltage controlled oscillator, a frequency divider, a phase comparator, and a low-pass filter, cascade interconnected via respective inputs and outputs, with the output of said filter connected to the oscillator input to provide said loop.

As is known, modern TV sets are equipped with a video picture tuner adapted to perform the tuning of a wide range of video signal frequencies.

Tuners usually incorporate a Voltage Controlled Oscillator (VCO), which can vary the oscillation frequency as the control voltage (Vctrl) applied to it changes.

When the user tunes to a given video transmission channel, the oscillator performs a control cycle or "loop" to frequency tune the selected video signal.

In addition, for automatic channel search purposes, that control loop is to converge as rapidly as possible.

To meet this demand, the oscillator is incorporated in a closed control loop comprising a frequency divider connected to the oscillator, a phase comparator connected to the frequency divider output, and a low-pass filter connected between the comparator output and the oscillator input to supply the oscillator with the control voltage Vctrl.

Another signal is passed to the comparator from a second oscillator, via another frequency divider, to supply a reference frequency F1 for comparison with the output frequency from the first-mentioned divider.

The frequency output by the VCO oscillator is divided by a programmable value N which defines the frequency of the selected video signal. The result is a frequency F2 which is tied, in a condition of equilibrium, to the reference frequency by the relation: $F2 = N * F1$. Following the comparison of the frequencies F2 and F1, the phase comparator will send a current signal Icomp to the low-pass filter to voltage control the VCO oscillator.

The value of the control voltage Vctrl follows a pattern, as a function of time, which is given by a curve for which three different operation conditions or phases can be recognized.

A first condition occurs where the value of the frequency F2 differs considerably from the reference frequency F1; the result is a very fast variation of the control voltage.

A second condition occurs where the frequency F2 lies close to the frequency F1, which results in the control voltage becoming stabilized.

A third condition relates to a situation where the frequencies F1 and F2 are equalized.

The convergence time for the control loop is given substantially by the sum of the durations of the first two operation conditions.

A first solution to the problem of reducing that convergence time could be that of increasing the reference frequency F1; however, such a solution cannot be universally applied because the reference frequency is technologically fixed by the type of resolution of the TV set.

Another solution could be one of acting on the output current from the phase comparator. When that current Icomp is small, the duration of the first operation condition becomes long, whereas the duration of the second operation condition becomes negligible. By contrast, when the output current from the comparator is large, the first operation condition has a short duration, but several oscillations are introduced which extend the duration of the second phase.

The oscillations produced by an elevated current Icomp are due to the phase comparator supplying the result of the comparison of the frequencies F1 and F2 at a rate given by the module of the difference between F1 and F2. Accordingly, a control loop so performed would be liable to undergo a damping effect that militates against a substantial reduction of the convergence time.

The technical problem that underlies this invention is to provide a circuit structure which has such design and performance characteristics as to afford very short duration, high efficiency control cycles for video frequency tuning, and overcome the drawbacks with which the prior art is beset.

This problem is solved by a circuit as indicated being characterized in that it comprises a second comparator connected in parallel to the phase comparator between the frequency divider output and the low-pass filter input to compare a reference frequency to the signal frequency output by the frequency divider when the values of such frequencies lie far apart.

The features and advantages of the inventive circuit will become more clearly apparent from the following detailed description of an embodiment thereof, to be taken by way of illustration and not of limitation in conjunction with the accompanying drawings.

Figure 1:
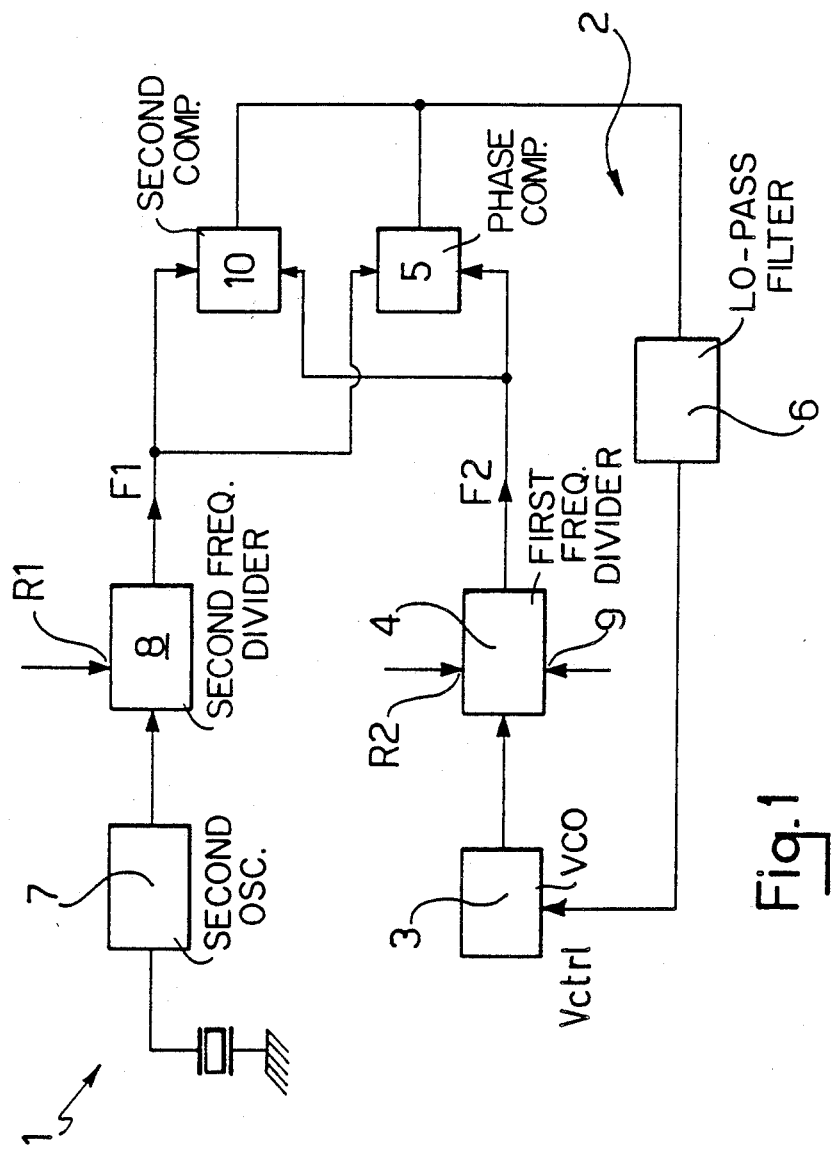
FIG. 1 shows the circuit of this invention in diagram form.

With reference to the drawing views, generally and schematically indicated at 1 is a circuit according to the invention for tuning video frequencies. The circuit 1 comprises a closed loop including a voltage controlled oscillator 3, a frequency divider 4, a phase comparator 5, and a low-pass filter 6. Such devices are all cascade connected to one another via respective inputs and outputs to constitute a loop 2, with the output of the filter 6 connected to the input of the oscillator 3 to supply it with a control voltage Vctrl.

The frequency divider 4 further comprises a reset input R2 and an input 9 adapted to receive a programmable signal defining a division factor N for the output frequency from the oscillator 3 which is related to a given video frequency selected by the user.

The circuit 1 includes a second oscillator 7 whose output is connected to a second frequency divider 8 which has, in turn, a reset input R1.

The oscillator 7 and divider 8 are operative to produce a reference frequency F1 for comparison to the output frequency F2 from the divider 4 of the control loop 2. For this purpose, the output from the second divider 8 is applied to an input of the phase comparator 5.

A second comparator 10 is advantageously provided which is parallel connected to the phase comparator 5, between the output of the divider 4 and the input of the filter 6. Also applied to an input of that second comparator 10 is the output from the second frequency divider 8.

The second comparator 10 is substantially effective to form, in combination with the oscillator 3, divider 4, and filter 6, a second control loop, operatively independent of the loop 2 and effective to compare the reference frequency F1 to the frequency F2 of the signal output by the divider 4 where the values of such frequencies lie far apart.

Figure 2:
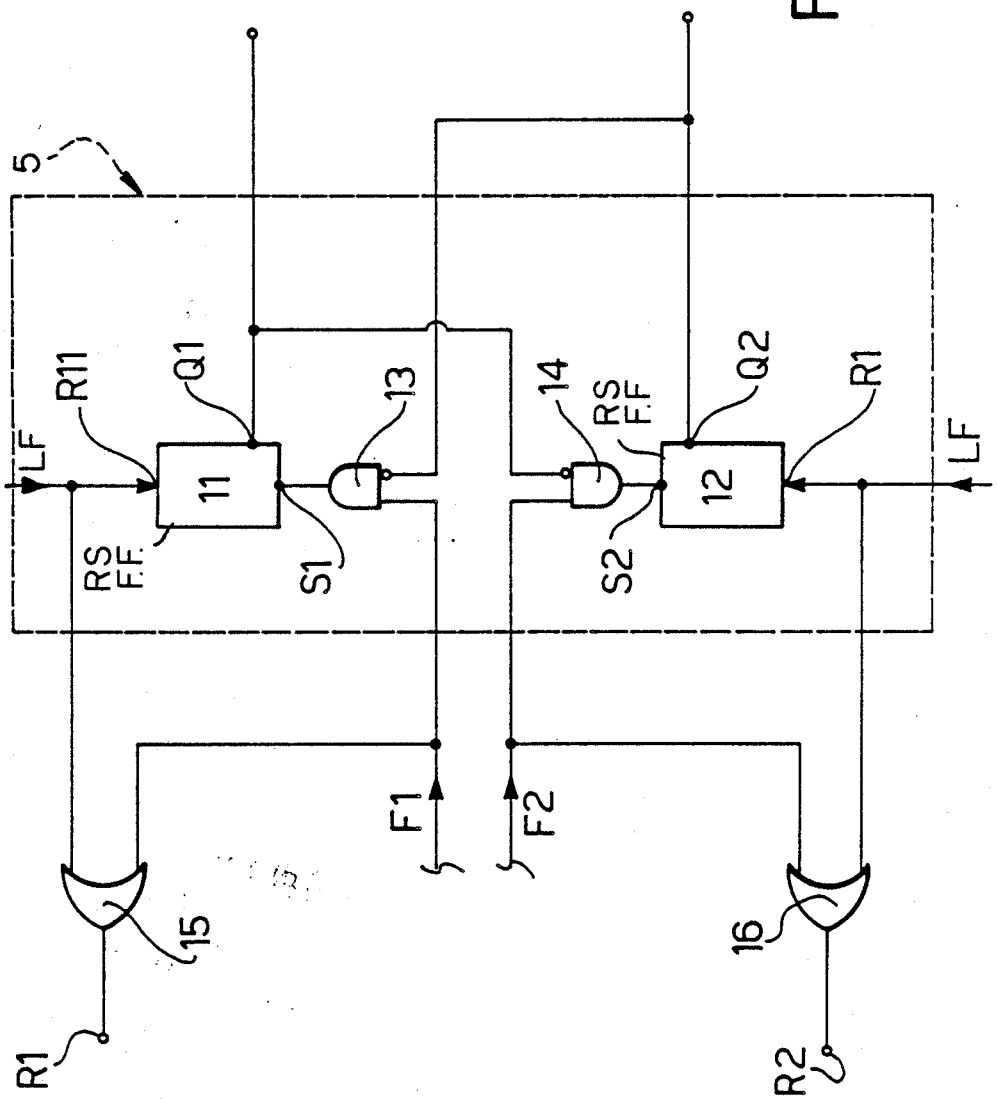
FIG. 2 is a diagram showing a detail of the circuit of FIG. 1.

With particular reference to FIG. 2, a preferred embodiment of the phase comparator 5 of the circuit 1 will be now described. That comparator comprises a pair of storage cells 11 and 12 of the RS type commonly called RS Flip-Flops (FF), each having respective set and reset inputs, indicated at S1 and R11 for the cell 11 and S2 and R12 for the cell 12, and respective outputs Q1 and Q2.

Connected to the set input of each cell is the output of a logic AND gate having two inputs, of which one is negated. Indicated at 13 is the AND gate associated with the cell 11 and having the negated input connected to the output Q2 of the cell 12. The other input of the gate 13 is connected to the output of the divider 8 to receive the reference frequency F1.

Likewise, the numeral 14 designates the AND gate connected to the output Q1 of the cell 11; also, the other input of that gate 14 is connected to the output of the divider 4 to receive the frequency F2 related to the selected video signal.

The reset inputs R11 and R12 of the cells 11 and 12 are effective to receive a reset signal LF which is also applied to a corresponding input of a logic gate pair 15 and 16 of the two-input OR type. The other input of the gate 15 receives the reference frequency F1 signal, and the output of that gate is connected to the reset input R1 of the divider 8.

The other input of the gate 16 receives instead the frequency F2 signal, and the output of that gate 16 is connected to the reset input R2 of the divider 4.

Figure 3:
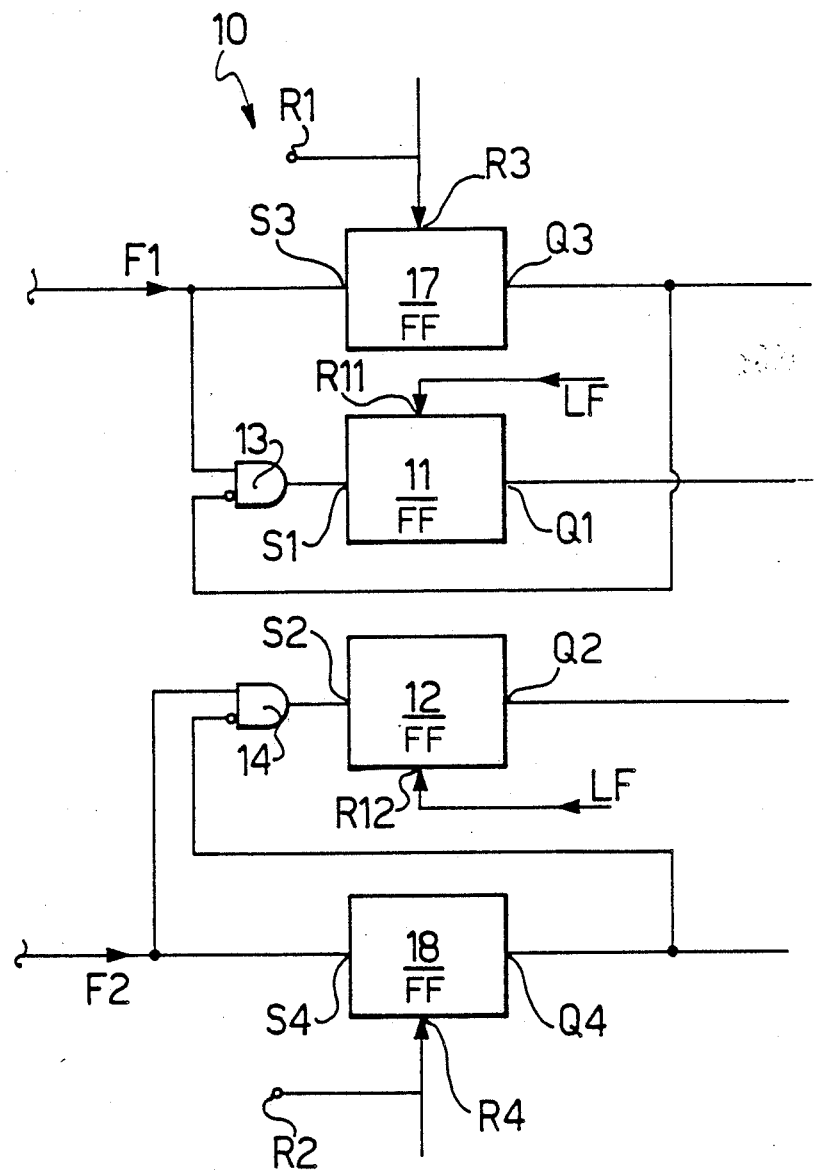
FIG. 3 is a diagram of a further detail of the circuit of FIG. 1.

With reference to FIG. 3, the structure will now be described of one embodiment of the second comparator 10 of the circuit 1. That comparator comprises cooperating items and parts having the same structures as described in relation to the comparator 5, and carrying the same references, thereby they will be no further discussed herein.

The comparator 10 comprises further storage cells (FFs) 17 and 18 of the RS type, which have respective outputs Q3 and Q4. The cells 17 and 18, moreover, comprise set and reset inputs indicated at S3 and R3, and S4 and R4, respectively.

To the input S3 is applied the reference frequency F1 signal, and to the input R3 the reset signal from the divider 8.

Applied to the input S4 is instead the frequency F2 signal, and the reset signal from the divider 4 to the input R4.

The negated input of the gate 13 is connected to the output Q3 of the cell 17, and the negated input of the gate 14 is connected to the output Q4 of the cell 18. The respective outputs Q3 and Q4 of the cells 17 and 18 are effective to supply logic information concerning the distance that the values of the frequencies F1 and F2 lie apart under the operation condition where such values are particularly far apart.

The operation of the circuit 1 according to the invention will be now described with particular reference to an initial state whereby the control cycle of the loop 2 is stabilized and the frequencies F1 and F2 to be compared are equalized.

On the user selecting a new video frequency, and consequently, on a new value for the dividing factor N being supplied to the divider 4, respective reset signals are simultaneously sent to the inputs R1, R2, R3, R4, R11 and R12 of the dividers 4 and 8 and the comparators 5 and 10.

In this way, the frequencies F1 and F2 are put back in phase, and the comparator outputs Q1 and Q2 are at a logic "0" low.

By way of illustrative example, it will be assumed that the selected frequency F2 is higher than the reference frequency F1.

Then the oscillator 3 will be still driven at a voltage Vctrl dependent on the previous value of the factor N with a a lower frequency F2 than F1.

The frequency signal F1, therefore, goes over to high logic "1" values in advance of the frequency signal F2. The output Q1 of the cell 11 then goes over to a logic "1" high, while the other output Q2 of the cell 12 remains at a logic "0" low.

This situation for the outputs Q1 and Q2 will substantially encode the frequency state F1 higher than the frequency F2 and induce a rise in the control voltage Vctrl, which drives the oscillator 3 to increase the frequency F2.

In view of the reset signals R1 and R2 being derived from the frequencies F1 and F2 via the gates 15 and 16, it follows that on each change-over of F2, the divider 4 will be reset and the frequencies F1 and F2 put back in phase.

Where, on the contrary, a higher frequency F2 is selected than the reference frequency F1, it is the output Q2 that is brought to a logic "1" high. With the solution just described, the comparison of the two frequencies is updated, under the operational condition with the frequencies far apart from each other, at the higher of frequencies F1 and F2, even though the relative distance separating such frequencies is unknown, and the control voltage variation will still be linear.

However, the comparator 10 may be used to supply information on the distance between the values of the frequencies F1 and F2 since the reset signal of the dividers 8 and 4 is concurrent with the signal of the lower of frequencies F1 and F2.

The outputs Q3 and Q4 of the comparator 10 respectively encode, in fact, a logic information relating to the comparison of the frequencies F1 and F2 to a mean frequency of F1 and F2. Accordingly, the update frequency will be effected at the least value between F1 and F2.

Thus, the circuit of this invention affords recognition of operational conditions under which, during the video signal synchronization, the frequencies F1 and F2 have values which lie far apart with respect to the operational conditions under which these values lie instead close together; furthermore, this circuit also enables the comparison mode for such frequencies to be defined during the former of said operational conditions.

The circuit according to the invention has, therefore, the advantage that it is little affected by damping phenomena, and the control cycle convergence time has shown to have been significantly reduced.

I claim:

1. A circuit for tuning video frequencies, of a type which comprises a closed loop including a voltage controlled oscillator, a first frequency divider, a phase comparator, an a low-pass filter, cascade interconnected via respective inputs and outputs, with the filter output connected to the oscillator input, characterized in that it comprises a second comparator connected in parallel to the phase comparator between the frequency divider output and the low-pass filter input to compare a reference frequency to the signal frequency output by the frequency divider when the values of such frequencies lie far apart, said phase comparator comprising a pair of flip-flop type storage cells having set and reset inputs, a pair of logic gates of the AND type having two inputs, one of which is negated, each gate having an output connected to a corresponding set input of one of said cells, and each cell having its corresponding output connected to the negated input of the gate associated with the other cell in said pair, with the other input of each gate arranged to receive a signal relating to one of said frequencies to be compared.

2. A circuit according to claim 1, further comprising a second oscillator and a second frequency divider connected to the second oscillator and having a reset input, said second frequency divider being operative to supply said reference frequency, said first frequency divider having a rest input, characterized in that each of said cells has a respective reset input connected, via one of two logic OR gates, to a corresponding reset input of said first divider and said second divider, with each said OR gate adapted to receive a signal on another input relating to one of said frequencies to be compared.

3. A circuit according to claim 2, characterized in that said second comparator includes two flip-flop type storage cells, each having a set input to which the reference frequency and signal frequency are respectively applied, and having respective reset inputs to each of which is applied the corresponding rest signal which is applied to said second frequency divider and to said first frequency divider.

4. A circuit for video frequency tuning, of a type which comprises a loop including a voltage controlled oscillator, a first frequency divider, a phase comparator, and a low-pass filter, cascade interconnected via respective inputs and outputs and with the filter output connected to the oscillator input to close said loop, and further comprising a second oscillator whose output is connected to a second frequency divider to produce a reference frequency for application to an input of said phase comparator, characterized in that it comprises a second comparator connected in parallel to the phase comparator between the output of the first frequency divider and the low-pass filter input, and including in at least one of the comparators at least one pair of storage cells of the RS flip-flop type having respective set inputs each adapted to receive the corresponding outputs from said dividers via a logic gate, each said cell having a rest input connected to a corresponding reset input of each divider via respective logic OR gates, each OR gate having an input connected to the output of one of said dividers.

* * * * *